(12) United States Patent
Conte

(10) Patent No.: US 10,593,400 B2
(45) Date of Patent: Mar. 17, 2020

(54) ROW DECODING ARCHITECTURE FOR A PHASE-CHANGE NON-VOLATILE MEMORY DEVICE AND CORRESPONDING ROW DECODING METHOD

(71) Applicant: STMicroelectronics S.r.l., Agrate Brianza (IT)

(72) Inventor: Antonino Conte, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 16/222,484

(22) Filed: Dec. 17, 2018

(65) Prior Publication Data
US 2019/0206488 A1    Jul. 4, 2019

(30) Foreign Application Priority Data

Jan. 4, 2018    (IT) ......................... 102018000000555

(51) Int. Cl.
*G11C 13/00* (2006.01)
*G11C 8/08* (2006.01)

(52) U.S. Cl.
CPC ............ *G11C 13/0028* (2013.01); *G11C 8/08* (2013.01); *G11C 13/003* (2013.01); *G11C 13/0004* (2013.01); *G11C 13/004* (2013.01); *G11C 13/0026* (2013.01); *G11C 13/0069* (2013.01); *G11C 2013/0045* (2013.01); *G11C 2013/0078* (2013.01); *G11C 2213/79* (2013.01)

(58) Field of Classification Search
CPC ......................... G11C 13/0028; G11C 13/0069

USPC ................................................ 365/148, 163
See application file for complete search history.

(56) References Cited

U.S. PATENT DOCUMENTS

| | | | | |
|---|---|---|---|---|
| 5,732,040 A | * | 3/1998 | Yabe | G11C 7/10 365/189.18 |
| 5,749,090 A | * | 5/1998 | Feng | G06F 12/0895 711/135 |
| 5,854,770 A | | 12/1998 | Pascucci | |
| 6,091,620 A | * | 7/2000 | Kablanian | G11C 5/025 365/189.02 |
| 6,233,198 B1 | * | 5/2001 | Choi | G11C 16/08 365/189.11 |
| 6,359,821 B1 | * | 3/2002 | Roohparvar | G11C 7/062 365/189.11 |

(Continued)

FOREIGN PATENT DOCUMENTS

EP        2159800 A1    3/2010

*Primary Examiner* — Michael T Tran
(74) *Attorney, Agent, or Firm* — Slater Matsil, LLP

(57) ABSTRACT

In an embodiment, a non-volatile memory device includes a memory array divided into a plurality of tiles, and a row decoder that includes main row decoding units associated to a respective group of tiles. The row decoded further includes local row decoding units, each associated to a respective tile for carrying out selection and biasing of corresponding word lines based on decoded address signals and biasing signals. Each local row decoding unit has logic-combination modules coupled to a set of word lines and include, for each word line, a pull-down stage for selecting a word line, and a pull-up stage. The pull-up stage is dynamically biased, alternatively, in a strong-biasing condition towards a tile-supply voltage when the word line is not selected, or in a weak-biasing condition when the word line is selected.

21 Claims, 6 Drawing Sheets

(56) References Cited

U.S. PATENT DOCUMENTS

| | | | |
|---|---|---|---|
| 9,299,395 B2* | 3/2016 | Kulkarni | G11C 5/145 |
| 9,299,410 B2* | 3/2016 | Sakai | G11C 11/1673 |
| 9,349,450 B2* | 5/2016 | Otsuka | G11C 13/0002 |
| 9,478,269 B2* | 10/2016 | Tao | G11C 11/419 |
| 9,824,729 B2* | 11/2017 | Su | G11C 7/12 |
| 10,217,467 B2* | 2/2019 | Chebiyyam | G10L 19/008 |
| 10,390,027 B2* | 8/2019 | Lasserre | H04N 19/30 |
| 10,395,736 B2* | 8/2019 | Tomita | G11C 13/0023 |
| 2006/0145193 A1 | 7/2006 | So et al. | |
| 2009/0303801 A1* | 12/2009 | Kim | B82Y 10/00 365/189.05 |
| 2010/0054011 A1* | 3/2010 | Kim | G11C 7/1048 365/49.17 |
| 2010/0128516 A1* | 5/2010 | Cho | G11C 7/12 365/163 |
| 2011/0063898 A1* | 3/2011 | Ong | G11C 7/18 365/158 |
| 2012/0314477 A1* | 12/2012 | Siau | G11C 8/08 365/148 |
| 2015/0055407 A1* | 2/2015 | Mantegazza | G11C 13/0069 365/163 |
| 2016/0379710 A1* | 12/2016 | Sekar | G11C 13/0002 365/148 |
| 2017/0140819 A1* | 5/2017 | Lee | G11C 13/0026 |
| 2018/0226122 A1* | 8/2018 | Schaefer | G11C 11/419 |
| 2018/0374519 A1* | 12/2018 | Goel | G11C 7/12 |
| 2019/0043874 A1* | 2/2019 | Thimmegowda | H01L 27/11582 |

* cited by examiner

ROW DECODING ARCHITECTURE FOR A PHASE-CHANGE NON-VOLATILE MEMORY DEVICE AND CORRESPONDING ROW DECODING METHOD

CROSS-REFERENCE TO RELATED APPLICATIONS

This application claims the benefit of Italian Application No. 102018000000555, filed on Jan. 4, 2018, which application is hereby incorporated herein by reference.

TECHNICAL FIELD

The present invention relates generally to an electronic system and method, and, in particular embodiments, to a row decoding architecture for a phase-change non-volatile memory device and corresponding row decoding method.

BACKGROUND

As is known, in so-called embedded phase-change memories (ePCMs), storage of information is obtained by exploiting phase-change materials, having the property of being able to switch between phases that have resistivities of considerably different value. In particular, these materials may switch between an amorphous phase, with high resistivity, and a crystalline or polycrystalline phase, with low resistivity. Consequently, in a phase-change memory cell it is possible to associate a different value of a datum stored in the cell to a respective amorphous or crystalline phase, and to a corresponding resistivity, of a corresponding phase-change memory element.

For instance, it is possible to use elements of group VI of the periodic table, such as tellurium (Te), selenium (Se), or antimony (Sb), referred to as "chalcogenides" or "chalcogenic materials," to form phase-change memory elements. An alloy made up of germanium (Ge), antimony (Sb), and tellurium (Te), known as GST (having chemical composition $Ge_2Sb_2Te_5$) currently finds wide use in such memory elements.

Phase switching in a memory element may be obtained by locally increasing the temperature of the region of phase-change material, for example, by causing passage of a programming electric current through resistive electrodes (generally known as "heaters") arranged in contact with the region of phase-change material. The electric current, by the Joule effect, generates the temperature profile required for phase change.

In particular, when the phase-change material is in the amorphous state, with high resistivity (the so-called RESET state), it is required to apply a first current pulse (the so-called SET pulse) of a duration and amplitude such as to enable the material to cool slowly. Subjected to this treatment, the phase-change material changes state and switches from the high-resistivity state to a low-resistivity crystalline state (the so-called SET state). Conversely, when the phase-change material is in the SET state, it is required to apply a second current pulse (the so-called RESET pulse) of large amplitude and short duration so as to cause the material to return into the high-resistivity amorphous state.

Reading of the datum stored in a memory cell may be carried out by applying to the phase-change material memory element a voltage sufficiently low as not to cause sensible heating thereof, and then by reading the value of the current flowing in the memory cell. Given that the current is proportional to the conductivity of the phase-change material, it is possible to determine in which phase the material is, and thus determine the datum stored in the memory cell.

In particular, a reading architecture for PCM devices is known, of a differential type, where two memory cells of opposite states are associated to each bit of a word to be read (made up, in a known way, of an appropriate number of bits). For instance, a bit has a value "1" if a first memory cell (so-called "direct memory cell") and a second memory cell (so-called "complementary memory cell") associated to the bit are, respectively, in the SET state and in the RESET state, and has a value "0" if the first and second memory cells are, respectively, in the RESET state and in the SET state. Differential-reading architectures afford advantages in terms of reliability, in so far as the datum is stored in a redundant way and moreover do not require generation of a reference current in so far as reading is carried out simply by comparing the currents flowing in the cells associated to a same bit.

In a known manner, the memory cells are arranged in a memory array in rows formed by word lines (WL) and columns formed by bit lines (BL).

As shown schematically in FIG. 1, each memory cell 2 comprises a phase-change element 2a and a selector element 2b, for example a MOSFET or (as illustrated in the figure) a bipolar junction transistor (BJT), which is electrically coupled to the heater associated to the phase-change element 2a (here not illustrated) so as to enable selective passage of a programming or reading electric current.

In the case of selector elements of a BJT type, the phase-change element 2a is coupled between the emitter terminal of the BJT, in the example of a pnp type, of the respective selector element 2b and a respective bit line BL. In addition, the base terminal of the selector element 2b is electrically coupled to a respective word line WL. The base terminals of the selector elements 2b of the memory cells 2 of a same row are coupled to a same word line WL, and the phase-change elements 2a of the memory cells 2 of a same column are coupled to a same bit line BL. The collector terminals of the BJTs of the selector elements 2b are set at a reference voltage, for example the ground reference voltage GND.

Use of selector elements 2b of a BJT type, to which the present discussion will make specific reference, affords some advantages over MOSFET technology, such as a reduction of the overall area occupied by the memory cells 2 and a resulting greater density of integration of the memory device.

However, use of selector elements of a BJT type requires, as compared to the use of MOSFETs, an appropriate consideration of the base currents of the respective BJTs, which flow along the word lines WL and may determine undesirable voltage drops along the same word lines WL.

FIG. 2 shows, in this regard, a memory array 3 of a memory device 1, of the phase-change type, the memory cells 2 of which are coupled to respective word lines WL (aligned in rows) and respective bit lines BL (aligned in columns). The phase-change elements 2a of the memory cells 2 are here represented schematically by respective resistor elements.

In particular, FIG. 2 shows the parasitic (or line) resistances associated to the bit lines BL, designated by RBL, and to the word lines WL, designated by RWL. Further represented are the base parasitic resistances of the BJTs of the selector elements 2b of the memory cells 2, designated by RB.

In the solution illustrated in FIG. 2, the base terminals of the selector elements 2b of a same row are coupled to a same metallization line, which is contacted at regular intervals, in the example every four memory cells 2, by a respective word line WL (in a way that will be evident to a person skilled in the field, the word lines WL are arranged at a higher metallization level than the base-metallization lines, in the layout of the memory array 3).

The memory device 1 further comprises, as illustrated schematically, a row decoder 4 and a column decoder 5, configured to address and bias in a suitable manner the word lines WL and the bit lines BL, respectively, each time selected for the (programming and reading) memory operations.

In particular, during the programming (or modify) and reading operations, a word line WL, addresses and selected, is typically biased at the ground reference voltage GND (in the example, the BJTs are of a pnp type). When not selected, the same word line WL is, instead, biased at a positive voltage, of an appropriate value.

Therefore, an electric current flows along a selected word line WL (with a value, which may even be high, that depends on the memory operation performed) that determines a line voltage drop due to the resistances associated to the word line WL (which are constituted by the line parasitic resistance RWL and the base parasitic resistance RBL). The biasing conditions of the memory cells 2 thus vary along a same word line WL, in an undesirable way, as a result of the voltage drop, according to the position occupied in the memory array 3.

In order to limit the above drawback, it has been proposed to split the memory array 3 into portions, so-called tiles, each tile comprising a certain number (for example, 256, 512, or 1024) of local word lines and local bit lines, which constitute portions of respective rows and columns of the entire memory array 3.

Selected words are in this case made up of a certain number of bits that are distributed on different tiles, thus limiting the number of memory cells selected and, consequently, the effect of the voltage drops on the word lines, within each tile.

Although advantageous, the above solution requires, however, multiplexing operations during reading and row address decoding operations that enable selection of the addressed memory cells 2 in the various tiles in order to reconstruct the data word. In general, it is rather complex to define a row decoding architecture enabling addressing of the memory cells 2 as desired and at the same time not entailing a significant burden in terms of manufacturing complexity and area occupation.

In greater detail, FIG. 3 shows a portion of the memory array 3 of the memory device 1, which comprises a group, in the example, of five tiles, arranged alongside one another on a same row; each tile, designated by 6, is formed, as indicated previously, by a certain number of memory cells, arranged in local word lines WL and local bit lines BL (here not illustrated).

The row decoder 4 in this case comprises: a main row decoding unit 8, associated to the group of tiles 6, configured to supply address-decoding and biasing signals, on the basis of address signals received at the input; and a number of local row decoding units 9, one for each tile 6 of the group, coupled to the main row decoding unit 8. In particular, the local row decoding units 9 have the function of locally selecting the word lines WL, i.e., setting to the ground reference voltage GND the same word lines WL, within the respective tiles 6.

Likewise, the column decoder 5 in this case comprises a plurality of local column-decoding units 10, one for each tile 6, which enable selection and biasing of the local bit lines BL associated to which are the memory cells that are to be read, and their connection to respective sense amplifiers (SAs) 11, configured for comparison of the reading currents of the (direct and complementary) memory cells associated to each bit of the data word.

In the example, thirty-two memory cells (i.e., sixteen data bits, given the differential reading) are read for each tile 6, so that sixteen sense amplifiers 11 are present for each tile 6. The resulting reading is made up of a double word, each word being constituted by thirty-two data bits plus seven bits of error-correction code (ECC) plus one redundancy bit. Thus, in total, 40+40 bits are read corresponding to 2 words, which correspond to 160 cells physically addressed on the aforesaid hypothesis of differential reading.

It should be noted that the number of memory cells read within each tile 6 in general depends on a maximum voltage drop that may be withstood on the word line WL; for example, in the case illustrated, reading of thirty-two memory cells may entail, in a real case, a voltage drop of approximately 100 mV on the local word line WL of the tile 6.

SUMMARY

The present Applicant has realized that row decoding solutions of a traditional type, which envisage the presence of a continuity of the row metallization lines through the various tiles 6 of the memory array 3, for biasing of the word lines WL (for example, for setting the word lines at the ground reference voltage GND), are not satisfactory, in so far as they entail routing problems. These problems are particularly important in the case where the pitch, i.e., the distance of separation, between the various memory cells, is small (especially in the direction of the columns of the memory array) in order to obtain a high density of the resulting memory device 1.

The present solution relates to a row decoding architecture for a non-volatile memory device, such as a non-volatile memory device of the phase-change type, and to a corresponding row decoding method.

Some embodiments provide an optimized row decoding architecture for a non-volatile memory device, in particular of the phase-change type.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF ILLUSTRATIVE EMBODIMENTS

Figure 1:
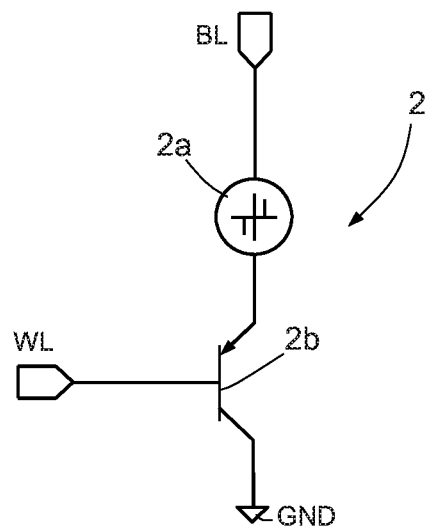
FIG. 1 is a schematic illustration of a phase-change memory cell, of a known type.
Figure 2:
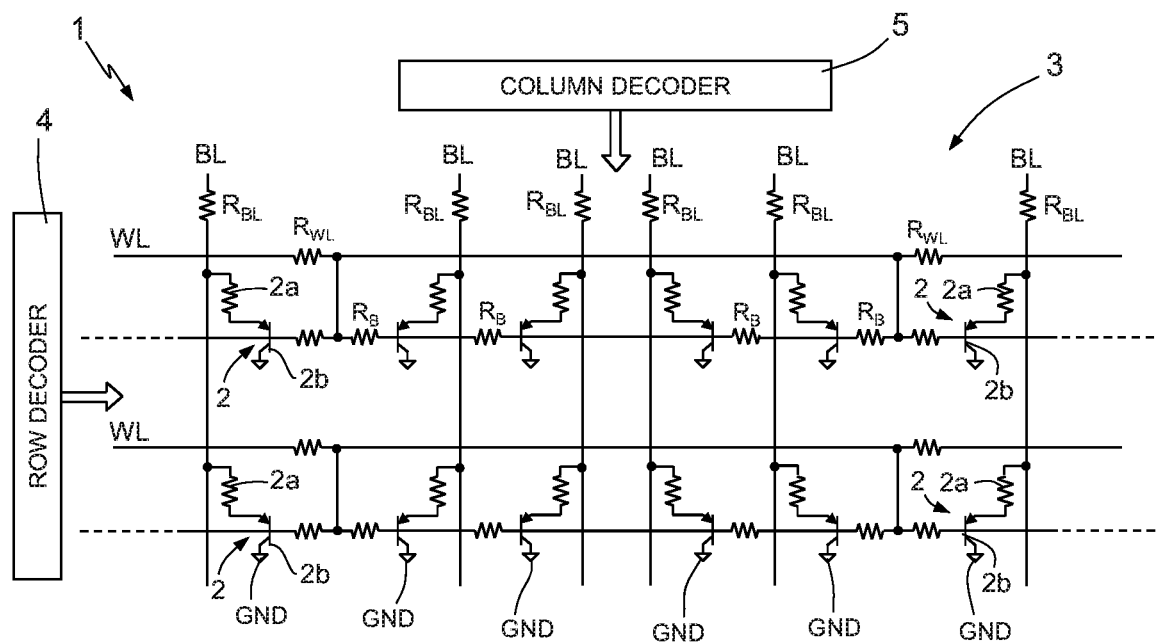
FIG. 2 is a schematic illustration of a portion of a memory array of a non-volatile memory device, of a known type.
Figure 3:
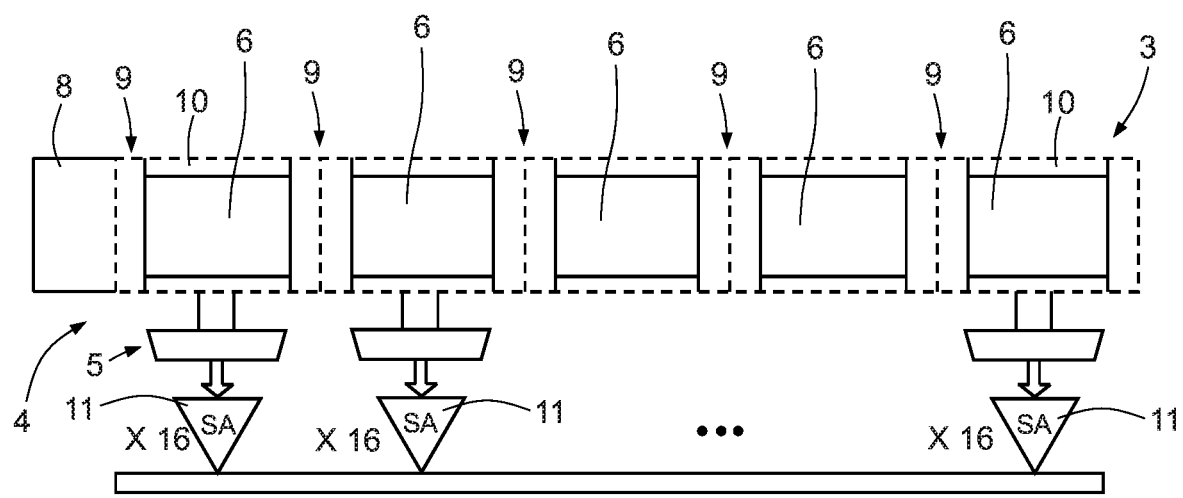
FIG. 3 shows a portion of the memory array of the memory device, divided into tiles.
Figure 4:
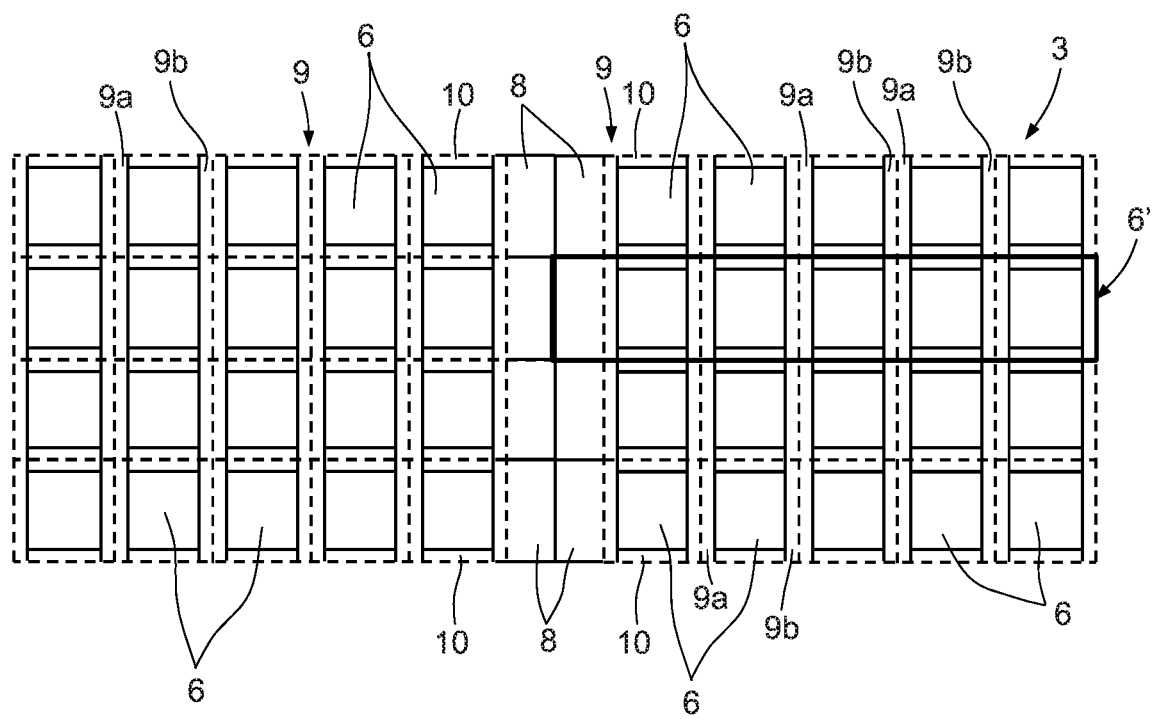
FIG. 4 shows a more enlarged portion of the memory array, with a group of tiles highlighted, according to one aspect of the present solution.

FIG. 4 is a schematic illustration of a portion of a memory array, once again designated by 3, of a non-volatile memory device 1, in particular of the phase-change type.

In a way similar to what has been previously indicated, the memory array 3 is divided into portions, the so-called tiles 6, which are in turn grouped together in groups of tiles (for example, five tiles in each group), which are arranged on a same row and are jointly subjected to an operation of reading of a word made up of a certain number of bits (just one of these groups of tiles 6, here designated by 6', is shown in FIG. 4, by way of example).

The row decoder 4 of the memory device 1 comprises: one main row decoding unit 8 for each group of tiles 6; and a number of local row decoding units, one for each tile 6 that is to be addressed in order to reconstruct the word, which are configured to carry out local selection and biasing of the word lines WL, on the basis of decoded address signals and biasing signals received from the main row decoding unit 8.

In particular, as highlighted schematically in FIG. 4, each local row decoding unit 9 comprises a first local-decoding element 9a and a second local-decoding element 9b, arranged on opposite sides of the respective tiles 6 (in the direction of the rows or word lines WL), coupled, as described in detail hereinafter, to a respective set of word lines WL, arranged with respect to one another in comb-fingered configuration.

Each local-decoding element 9a, 9b is configured to implement biasing of each of the respective word lines WL alternatively to the ground reference voltage GND (in the selected state for a memory operation of reading or programming) or to a tile-supply voltage (in the non-selected state).

Figure 5:
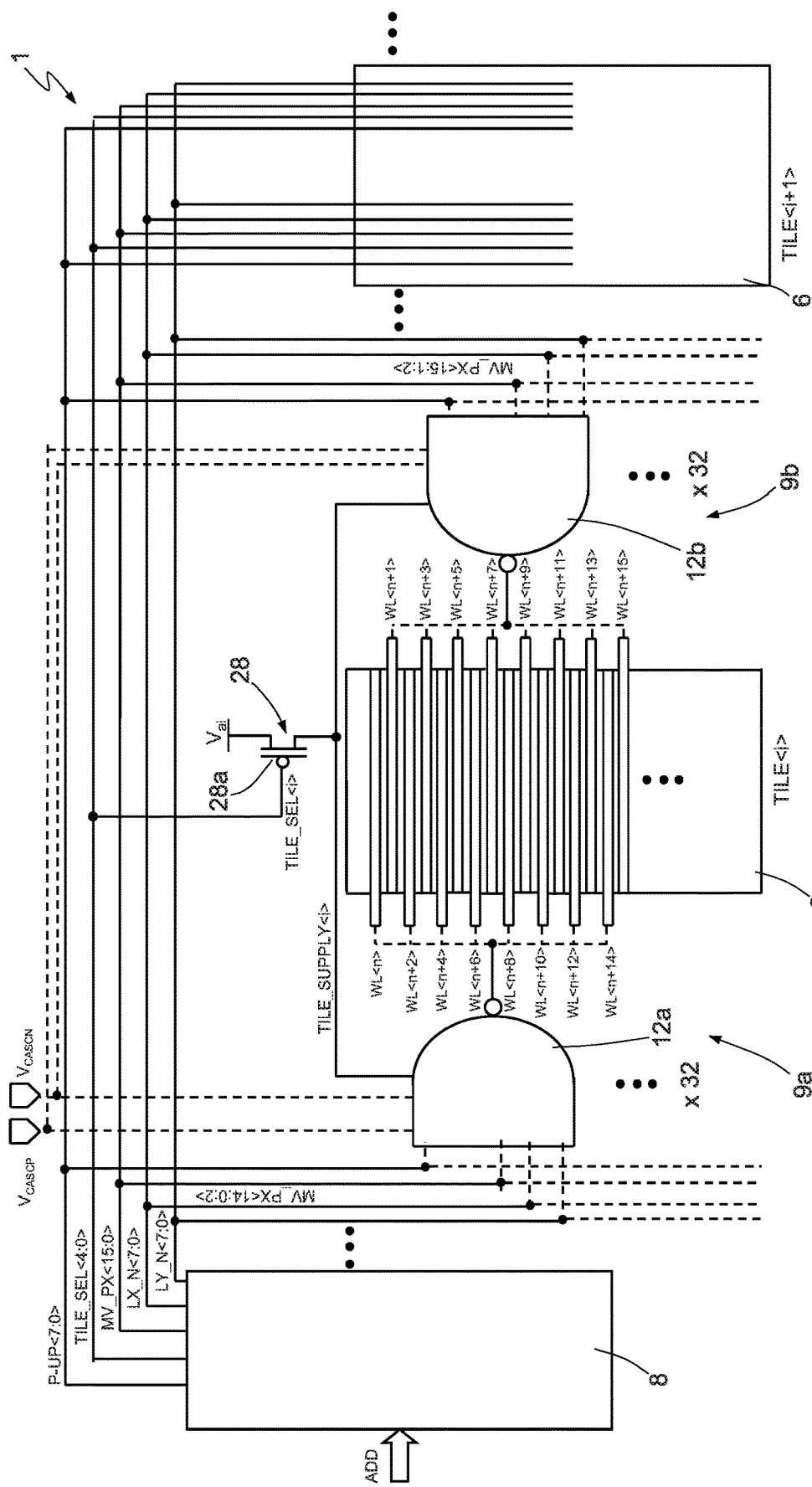
FIG. 5 is a block diagram of a non-volatile memory device, according to one embodiment of the present solution.

With reference also to FIG. 5 (which refers, by way of example, to a single group of tiles 6), each local-decoding element 9a, 9b of the local row decoding unit 9 implements a respective plurality of NAND logic-combination modules 12a, 12b, each configured to drive a respective set of word lines WL (and the corresponding memory cells, not illustrated herein) on the basis of the NAND logic combination of respective decoded address signals received at the input.

In detail, each NAND logic-combination module 12a, 12b has a number of outputs, each connected to a respective word line WL of the tile 6, to which it is to supply alternatively the ground reference voltage GND (in the case where the word line WL is to be selected), in this case implementing an operation of "pull-down" of the respective word line WL, or the voltage of a tile-supply signal TILE_SUPPLY (in the case where the word line WL is in the non-selected state), in this case implementing an operation of "pull-up" of the respective word line WL.

In the embodiment provided by way of example, to which the aforesaid FIG. 5 refers, the corresponding NAND logic-combination modules 12a, 12b of the first and second local-decoding elements 9a, 9b have respective outputs (in the example, eight in number), connected to respective word lines WL, comb-fingered together. In particular, each word line WL has a first end coupled to an output of the respective NAND logic-combination module 12a, 12b and a second, free, end, opposite to the first end.

In detail, and considering a generic tile TILE<i>, the NAND logic-combination modules 12a of the first local-decoding element 9a have outputs that drive the word lines WL<n>, WL<n+2>, WL<n+4>, WL<n+6>, WL<n+8>, WL<n+10>, WL<n+12>, and WL<n+14>, and the NAND logic-combination modules 12b of the second local-decoding element 9b have outputs that drive the word lines WL<n+1>, WL<n+3>, WL<n+5>, WL<n+7>, WL<n+9>, WL<n+1>, WL<n+13>, and WL<n+15> of the respective tile 6 (where n is an integer comprised between 0 and 31, in the embodiment provided by way of example where it is assumed that each tile 6 comprises a number of local word lines equal to 512, with a number of NAND logic-combination modules 12a, 12b equal to 32).

Each NAND logic-combination module 12a, 12b has a certain number of address inputs, designed to receive, from the main row decoding unit 8, decoded address signals, namely: first inputs designed to receive first decoded address signals, designated by MV_PX, in the example eight in number (in detail, the NAND logic-combination modules 12a of the first local-decoding element 9a have first address inputs that receive the decoded address signals MV_PX<0>, MV_PX<2>, MV_PX<4>, MV_PX<6>, MV_PX<8>, MV_PX<10>, MV_PX<12>, and MV_PX<14>, i.e., MV_PX<14:0:2>; and the NAND logic-combination modules 12b of the second local-decoding element 9b have inputs that receive the decoded address signals MV_PX<1>, MV PX<3>, MV_PX<5>, MV_PX<7>, MV_PX<9>, MV_PX<11>, MV PX<13>, and MV PX<15>, i.e., MV PX<15:1:2>); a second address input designed to receive a second decoded address signal LX_N<j> (with, e.g., j=0-7); and a third address input designed to receive a third decoded address signal LY_N<m> (with, e.g., m=0-7).

It should thus be noted that, in the implementation example where thirty-two NAND logic-combination modules 12a, 12b are present for each individual tile 6, each of the second and third decoded address signals LX_N<j>, LY_N<m> is received at the input by four respective NAND logic-combination modules 12a, 12b (it is again emphasized that this embodiment is provided purely by way of example in order to facilitate an understanding of the present solution, and is not to be understood as limiting).

As will emerge clearly to a person skilled in the field, the value of the decoded address signals MV_PX, LX_N, LY_N is generated, by the main row decoding unit 8, as a function of address signals ADD received at the input and is such as to select each time one and only one word line WL of the tile 6 for memory (reading or programming) operations, bringing the same word line WL to the ground reference voltage GND (i.e., performing pull-down of the local word line WL).

Each NAND logic-combination module 12a, 12b further has: a tile-supply input, designed to receive a tile-supply signal TILE_SUPPLY<i>, generated as will be discussed in detail hereinafter, for the respective tile 6 (with i=0-4 in the example where each group of tiles is formed by five tiles 6); and a pull-up input, designed to receive a biasing control signal P-UP<k> (with k=0-7). It should be noted that, in the implementation example illustrated, also each biasing control signal P-UP<k> is received at the input by four NAND logic-combination modules 12a, 12b.

In the embodiment illustrated, each NAND logic-combination module 12a, 12b further has: a first cascode input and a second cascode input, which are designed to receive, respectively, a first cascode voltage VCASCN and a second cascode voltage VCASCP, of appropriate value (as described hereinafter), common for all the tiles 6.

According to a particular aspect of the present solution, and as illustrated schematically once again in FIG. 5, the signal lines (metallization lines) that carry the decoded address signals MV_PX<15:0>, LX_N<7:0>, and LY_N<7:0>, the biasing-control signals P-UP<7:0>, and the tile-selection signals TILE_SEL<4:0> through the tiles 6 of the group extend horizontally starting from the main row decoding unit 8, (i.e., parallel to the rows of the memory array 3 and to the word lines WL of the tiles 6) throughout the entire group of tiles 6 associated to the main row decoding unit 8, and, at each tile 6, the same lines extend vertically (i.e., parallel to the columns of the memory array 3 and to the bit lines BL of the tiles 6) so as to reach the local-decoding elements 9a, 9b of the respective local row decoding unit 9, which are arranged on opposite sides of the tile 6. It is understood that metallization lines (e.g., in metal layers 1, 2, 3, 4 or other), such as the signal lines, extend in a direction parallel to a surface of the substrate (not shown).

Advantageously, horizontal routing of the aforesaid signal lines may be implemented in the same area of the layout of the memory device 1 dedicated to the local column-decoding units 10, in an area distinct from the area occupied by the tiles 6 and by the corresponding memory cells, so as not to interfere with the distribution of the word lines WL within the same tiles 6. In particular, the signal lines may be appropriately provided on higher metallization levels of the stack, and not in the bottom metallization levels where the word lines WL are provided and where the pitch between the lines is more critical. Furthermore, also vertical routing of the signal lines themselves, at the opposite sides of the tiles 6, does not interfere with the arrangement of the word lines WL.

Driving of the local word line WL in an alternated manner (i.e., in a comb-fingered way) by the NAND logic-combination modules 12a, 12b of the local-decoding elements 9a, 9b contributes to optimizing the occupation of area and to further limiting the possibility of congestion of the signals within the tiles 6.

It should further be noted that the same decoded address signals MV_PX<15:0>, LX_N<7:0>, and LY_N<7:0>, the same biasing-control signals P-UP<7:0>, and the same tile-selection signals TILE_SEL<4:0> are supplied by the main row decoding unit 8 to all the tiles 6 of a same group of tiles.

Figure 6:
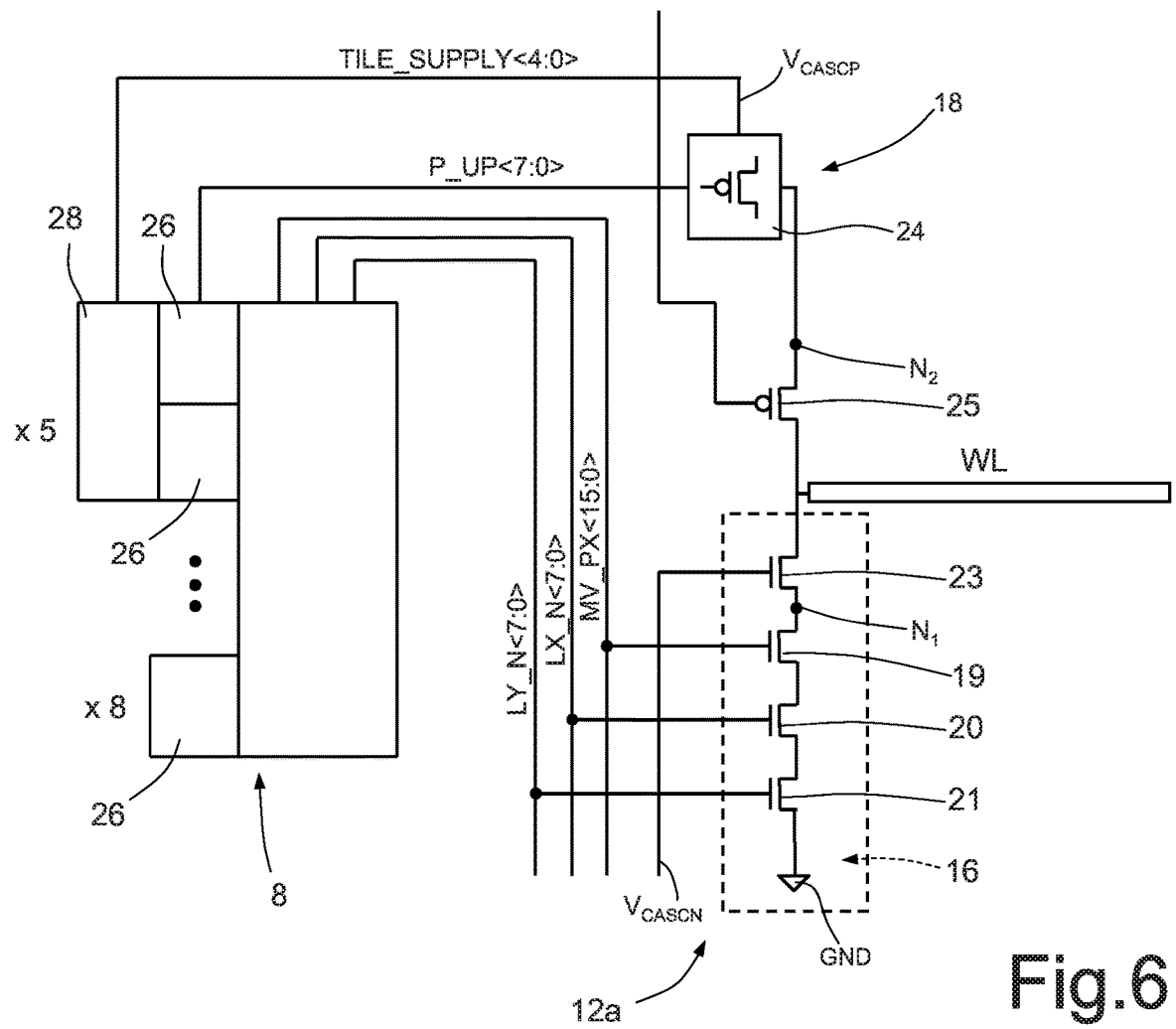
FIG. 6 is a more detailed block diagram of a portion of the memory device of FIG. 5.

As shown schematically in FIG. 6 (which represents just a first end portion of a single word line WL, for reasons of simplicity of depiction), each NAND logic-combination module 12a, 12b comprises, for each word line WL: a pull-down stage 16, coupled to the respective word line WL and controlled by respective decoded address signals MV_PX, LX_N, LY_N so as to bring selectively the voltage of the same word line WL to the ground reference voltage GND, for a specific combination of the respective decoded address signals MV_PX, LX_N, LY_N; and a pull-up stage 18, coupled to the word line WL and controlled by a respective biasing control signal P-UP so as to bring the same word line WL to the voltage of the respective tile-supply signal TILE_SUPPLY.

According to one aspect of the present solution, the pull-down stage 16 comprises, once again for each word line WL associated thereto: a first pull-down MOS transistor 19, a second pull-down MOS transistor 20, and a third pull-down MOS transistor 21, in the example of an NMOS type, which are connected in series between a first internal node N1, coupled to the respective word line WL, and a terminal at the ground reference voltage GND, and are controlled, respectively, by a first decoded address signal MV_PX, a second decoded address signal LX_N, and a third decoded address signal LY_N. In the embodiment illustrated, the pull-down stage 16 further comprises a first cascode transistor 23, in the example of an NMOS type, connected between the first internal node N1 and the respective word line WL and controlled by the first cascode voltage VCASCN (of a suitable value, such as to protect the word line WL from excessive voltages).

Likewise, the pull-up stage 18 comprises, once again for each local word line WL associated thereto: a pull-up MOS transistor 24, in the example of a PMOS type, which is connected in series between a second internal node N2, coupled to the respective word line WL, and a terminal at the voltage of the tile-supply signal TILE_SUPPLY, and is biased by a respective biasing control signal P-UP, received on its gate terminal. In the embodiment illustrated, the pull-up stage 18 further comprises a second cascode transistor 25, in the example of a PMOS type, connected between the second internal node N2 and the respective word line WL and controlled by the second cascode voltage VCASCP (of a suitable value, once again to protect the word line WL from excessive voltages).

As will be described in detail hereinafter, each NAND logic-combination module 12a, 12b comprises a certain number (in the example discussed previously, eight) of pull-up MOS transistors 24 (coupled to the respective local word lines WL associated to a same NAND logic-combination module 12a, 12b). These pull-up MOS transistors 24 are biased by a same biasing control signal P-UP and jointly define a set of pull-up switches, thus constituting a so-called pull-up group switch.

In particular, as shown schematically in the aforesaid FIG. 6, the main row decoding unit 8 comprises a suitable number of pull-up decoding modules 26, each designed to generate, as will be described in greater detail hereinafter, a respective biasing control signal P-UP<k> (in the implementation example described, with k=0-7, the main row decoding unit 8 thus comprising eight pull-up modules 26).

According to a particular aspect of the present solution, biasing of the pull-up stage 18 by the biasing-control signals P-UP generated by the pull-up decoding modules 26 of the main row decoding unit 8 is of a dynamic type, i.e., variable between two possible biasing states: a "strong" biasing state, and a "weak" biasing state.

In particular, the value of each biasing control signal P-UP (which, as mentioned previously, drives a set of pull-up MOS transistors 24 within a same NAND logic-combination module 12a, 12b) is variable between: a first voltage value (denoted in what follows by SHIFTED_GND), of low value (corresponding to an appropriately shifted value of the ground reference voltage GND, for example, 1.8 V), which entails strong biasing of the pull-up MOS transistor 24 in the on state, with a strong pull-up current (in other words, the resistance of the pull-up MOS transistor 24 is very low, determining passage of a high current towards the line set at the voltage of the tile-supply signal TILE_SUPPLY); and a second voltage value (denoted in what follows by PUP_BIAS), of a high value higher than the aforesaid first voltage value (close to the voltage of the tile-supply signal TILE_SUPPLY, for example, 3.6 V), which entails weak biasing of the pull-up MOS transistor 24 with a weak pull-up current (in other words, the resistance of the pull-up MOS transistor 24 is higher, thus determining passage of a low current towards the line set at the voltage of the tile-supply signal TILE_SUPPLY).

Figure 7:
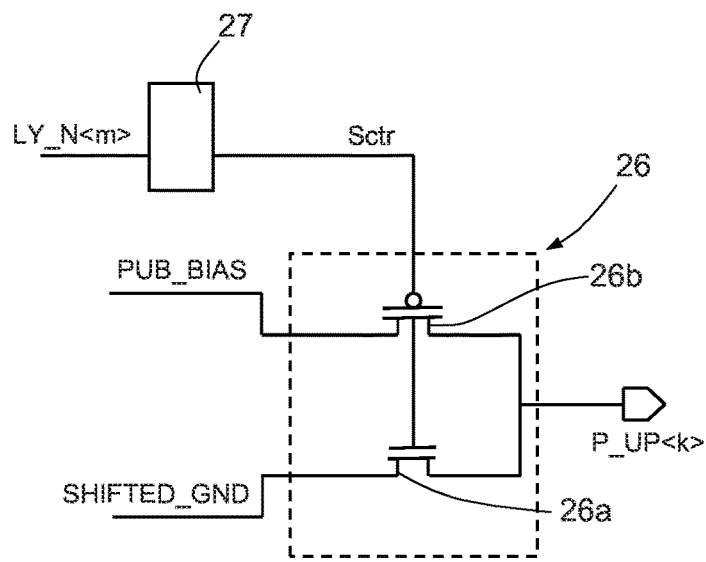
FIG. 7 is a circuit diagram of functional blocks of the memory device.

In greater detail, and as illustrated in FIG. 7, each pull-up decoding module 26 of the main row decoding unit 8 is configured to receive at the input: at least a respective row address signal, for example associated to a third decoded address signal LY_N<m>, possibly appropriately level-shifted to a higher voltage or subjected to further processing operations by a processing block 27, for generation of a control signal Sctr (it should be noted that the number of pull-up decoding modules 26 corresponds in this case to the number of the third address signals LY_N); the first voltage value SHIFTED_GND; and the second voltage value PUP_BIAS. Each pull-up module 26 further has an output that supplies a respective biasing control signal P-UP<k>. It should be noted, in particular, that the third decoded address signal LY_N<m> is the same signal as the one received at the input by the NAND logic-combination module 12a, 12b to which the biasing control signal P-UP<k>, generated by the pull-up decoding module 26, is supplied.

In detail, each pull-up module 26 implements a so-called pass-gate, formed by: an NMOS transistor 26a, connected between the input that receives the first voltage value SHIFTED_GND and the output that supplies the respective biasing control signal P-UP<k>; and a PMOS transistor 26b, connected between the input that receives the second voltage value PUP_BIAS and the output that supplies the respective biasing control signal P-UP<k>. The NMOS transistor 26a and the PMOS transistor 26b are both controlled by the same control signal Sctr, which corresponds to the row address signal received at the input, in the example to the respective third decoded address signal LY_N<m>.

Thus, according to the value of the aforesaid control signal Sctr, the pull-up module 26 supplies at the output, as the value of the respective biasing control signal P-UP<k>, alternatively the first voltage value SHIFTED_GND or the second voltage value PUP_BIAS, in this way determining the condition of strong or weak biasing of the associated pull-up stage 18.

Operation of each NAND logic-combination module 12a, 12b envisages that the corresponding pull-up stages 18 are normally ON, with the corresponding pull-up MOS transistors 24 ON, so as to couple the respective local word lines WL to the voltage of the corresponding tile-supply signal TILE_SUPPLY.

In particular, the value of the biasing control signal P-UP<k>, generated by the respective pull-up module 26 of the main row decoding unit 8, is normally such as to determine the condition of strong biasing of the pull-up stage 18 (the biasing control signal P-UP<k> is at the first voltage value SHIFTED_GND). In this condition, all the word lines WL associated to the NAND logic-combination module 12a, 12b are in the non-selected state.

When selection of a specific word line WL of the tile 6 is requested, the value of the biasing control signal P-UP<k> is switched by the respective pull-up module 26 of the main row decoding unit 8 so as to determine the condition of weak biasing of the pull-up stage 18 to which the same word line WL is coupled (i.e., of all the pull-up MOS transistors 24 of the same pull-up group switch, which are also controlled by the same biasing control signal P-UP<k>). In particular, the biasing control signal P-UP<k> is switched to the second voltage value PUP_BIAS, as a result of assertion of the respective row address signal received at the input, in the example the respective third decoded address signal LY_N<m>, which is brought, in the example, to the high state. It should be noted that, alternatively, the biasing control signal P-UP<k> could be switched as a function of a different combination of the decoded address signals MV_PX, LX_N, LY_N, in an appropriate manner, according to the implemented address-decoding mode.

The pull-down stage 16, to which the word line WL that is to be selected is coupled, appropriately controlled by the decoded address signals MV_PX, LX_N, LY_N, is thus able to force the voltage of the word line WL to the ground reference voltage GND, overcoming a weak pull-up current. Advantageously, the operation of selection of the local word line WL thus entails a low current consumption, required to "overcome" the pull-up towards the supply.

To deselect the word line WL previously selected, the value of the biasing control signal P-UP<k> is switched by the respective pull-up module 26 of the main row decoding unit 8 to the first voltage value SHIFTED_GND, so as to determine once again the condition of strong biasing of the pull-up stage 18 to which the word line WL is coupled. Advantageously, the operation of deselection of the local word line WL is in this way carried out at a high speed (associated to the high pull-up current that flows through the pull-up MOS transistors 24) and with rather short response times (for example, in the region of 1-2 ns).

According to a further aspect of the present solution, as shown schematically in the aforesaid FIG. 6 and in the previous FIG. 5, to which reference is made again, the main row decoding unit 8 is further associated to an appropriate number of tile-selection modules 28, one for each of the tiles 6 of the respective group of tiles, each configured to select individually the respective tile 6 for a memory operation, based on a tile-selection signal TILE_SEL. In particular, each tile-selection module 28 is designed to generate the tile-supply signal TILE_SUPPLY<i> for a respective tile 6 (in the implementation example described, with i=0-4, the main row decoding unit 8 thus comprises five tile-selection modules 28).

In detail, and as illustrated in the previous FIG. 5, each tile-selection module 28 defines a switch element, for example provided by a respective PMOS transistor 28a, which selectively connects to a supply voltage Val of the memory device 1, for example, 3.8 V, a respective output line that carries the tile-supply signal TILE_SUPPLY<i> to the respective tile 6, on the basis of the respective tile-selection signal TILE_SEL<i> (in particular, the tile-selection signal TILE_SEL<i> is supplied on the gate terminal of the PMOS transistor 28a).

Advantageously, the tile-selection modules 28 thus enable selection (i.e., coupling to the supply voltage Val), during programming operations, of even just one tile 6 associated to the main row decoding unit 8, whereas some or even all of the other tiles 6 of the same group may be decoupled, or insulated, from the same supply voltage Val (it is possible to obtain a minimum parallelism in programming equal to a single tile 6).

Figure 8:
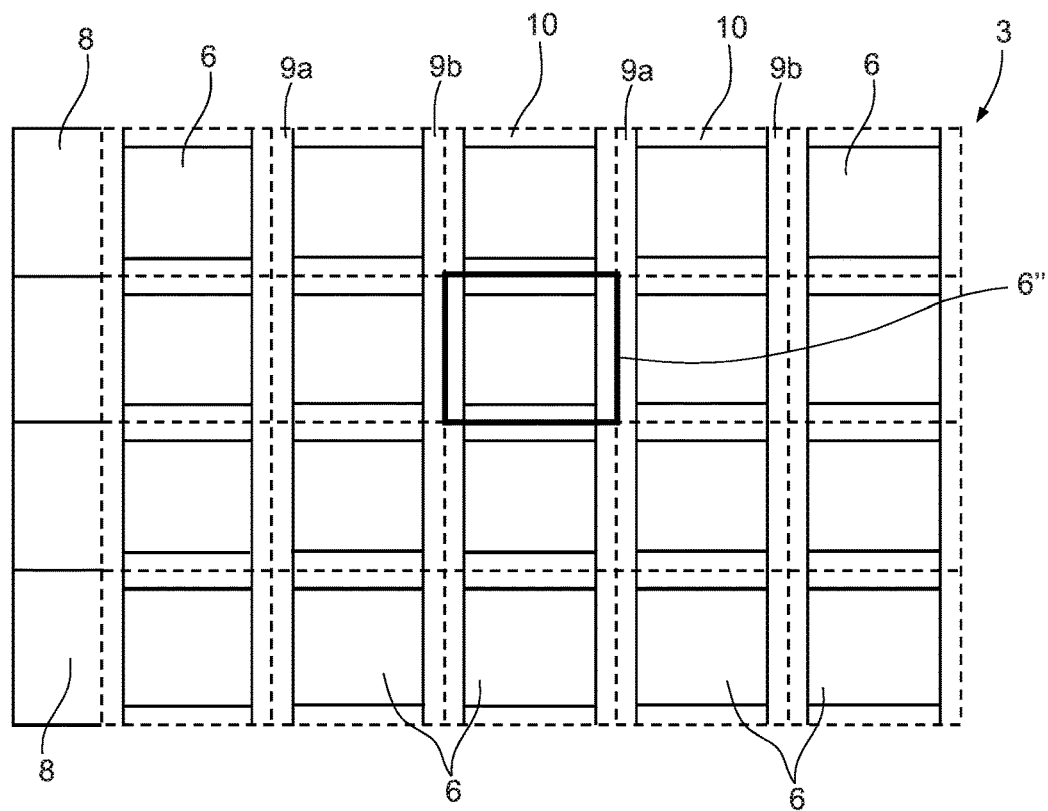
FIG. 8 is a schematic illustration of a portion of the memory device, with a selected tile highlighted.

This operating condition is schematically illustrated in FIG. 8, which shows, in a way similar to FIG. 4, a portion of the memory array 3 of the memory device 1, where just one tile, here designated by 6", of the group of tiles associated to a given main row decoding unit 8 is selected, during an operation of programming of the corresponding memory cells.

Advantageously, it is in this way possible to markedly reduce the leakage (i.e., the current dispersions) during the programming operations, in this case limitedly to the single tile 6 selected, whereas the other tiles 6 of the same group remain insulated from the supply and consequently do not contribute to leakage.

In this regard, it is highlighted that, during programming, the word lines WL not addressed of the selected tile 6 are biased at a high biasing voltage, which may cause a high leakage current towards the base terminals of the selection transistors of the memory cells coupled to the same word lines WL, and a high electrical consumption of an associated charge pump that generates the aforesaid biasing voltage.

Instead, during a reading operation, where, as discussed previously, the bits of the word to be read are reconstructed starting from reading of the tiles 6 of a respective group, the tile-selection modules 28 of a main row decoding unit 8 may select also all the tiles 6 associated to a same main row decoding unit 8.

Figure 9:
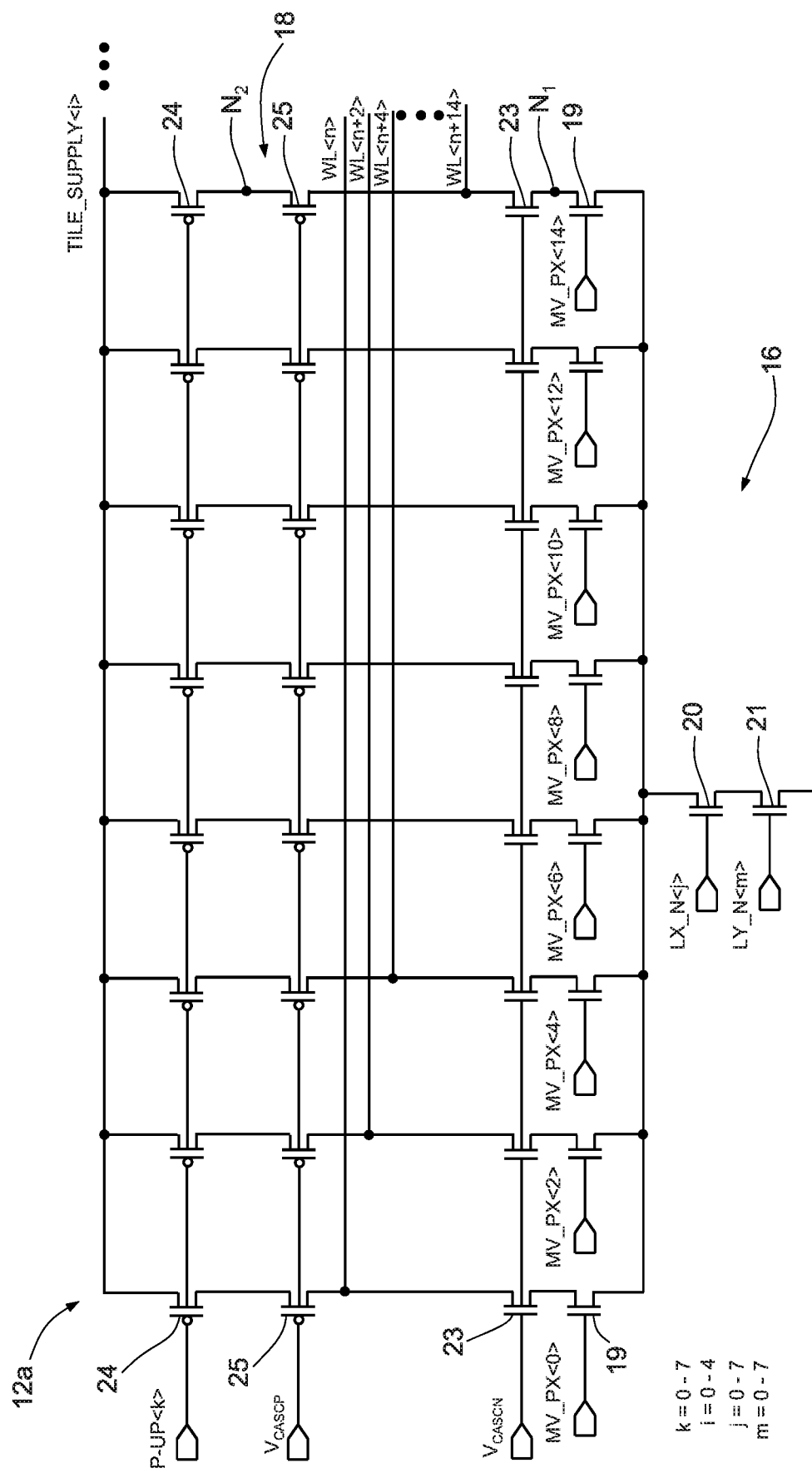
FIG. 9 is a circuit diagram of a logic-combination module, for decoding row addresses in the memory device.

FIG. 9 shows, in greater detail, a possible circuit implementation of a NAND logic-combination module 12a, belonging by way of example to a local-decoding element 9a, which thus receives at the input the first decoded address signals MV_PX<14:0:2> and is coupled at the output to the local word lines WL<n+14:n:2>.

As discussed previously, the NAND logic-combination module 12a further receives at the input: a respective second decoded address signal LX_N<j>; a respective third decoded address signal LY_N<m>; a respective biasing control signal P-UP<k>; and the respective tile-supply signal TILE_SUPPLY<i>.

Again, as previously discussed, the NAND logic-combination module 12a comprises, for each of the word lines WL<n+14:n:2> driven at the output: the respective pull-down stage 16, controlled by the respective decoded address signals MV_PX<14:0:2>, LX_N<j>, and LY_N<m> for bringing the voltage of one of the word lines WL<n+14:n:2> to the ground reference voltage GND; and the respective pull-up stage 18, controlled by the respective biasing control signal P-UP<k> (which controls all the pull-up MOS transistors 24 of the stage) to maintain the word lines not selected at the voltage of the respective tile-supply signal TILE_SUPPLY<i>.

The NAND logic-combination module 12a further comprises the first and second cascode transistors 23, 25, which are coupled to a respective one of the local word lines WL<n+14:n:2> and are controlled by the first and second cascode voltages VCASCN, VCASCP, respectively.

During operation, the NAND logic-combination module 12a maintains the local word lines WL<n+14:n:2> at the tile-supply voltage TILE_SUPPLY<i>, when not selected as a function of the decoded address signals MV_PX<14:0:2>, LX_N<j>, and LY_N<m> received at the input. In particular, the pull-up MOS transistors 24 of the pull-up stage 18 are driven into the ON state by the respective biasing control signal P-UP<k> (which has a low value, corresponding to the first voltage value SHIFTED_GND), in a strong-biasing condition, i.e., with a high pull-up current towards the line set at the voltage of the tile-supply signal TILE_SUPPLY<i>.

When, instead, one of the local word lines WL<n+14:n:2> is selected, i.e., is brought to the ground reference voltage GND by the combination of the associated decoded address signals MV_PX<14:0:2>, LX_N<j>, and LY_N<m> (all of which are set at the high value, in the example illustrated), the respective biasing control signal P-UP<k> switches to the high value, corresponding to the second voltage value PUP_BIAS, so as to bring into a weak-biasing condition the pull-up MOS transistors 24 and thus facilitate selection of the above local word line WL<n+14:n:2>, "overcoming" a weak pull-up current (through the respective pull-up MOS transistor 24).

The advantages of the present solution emerge clearly from the foregoing description.

In any case, it is highlighted that dynamic biasing of the pull-up stage 18 of the NAND logic-combination modules 12a, 12b enables a reduction of the electric current consumption, in particular during selection of the word lines WL of the corresponding tile 6, thanks to the possibility of switching the pull-up MOS transistors 24 into the weak-biasing state. Furthermore, the speed of deselection of the word lines WL is increased, thanks to the possibility of switching the pull-up MOS transistors 24 into the strong-biasing state.

The solution described enables reduction of the leakage of electric current during the programming (or modify) operations, thanks to the possibility of selecting individually even just one tile 6 for storage operations. This characteristic is particularly advantageous for applications that envisage a reduced consumption of current, such as radio-frequency (RF) applications.

In addition, the layout of the row decoding architecture enables an optimization of the area occupation, in particular thanks to the absence of a horizontal routing internally to the tiles 6, through the entire group of tiles. As previously highlighted, in fact, routing of the address-decoding and biasing signals is provided at a higher metallization level with respect to the word lines WL and in a different area with respect to the one occupied by the memory cells of the same tiles 6. All the signals used for row decoding are carried vertically within each tile 6, towards the respective word lines WL, at the opposite ends of the word lines WL, once again without creating any "jams" in routing of the signals.

Furthermore, arrangement of the local-decoding elements 9a, 9b on opposite sides of the respective tiles 6 (in the direction of the rows), coupled to respective word lines WL arranged in comb-fingered configuration, enables doubling of the vertical pitch for routing of the word lines WL (i.e., the space available for providing the metallization lines of the word lines WL).

The aforesaid comb-fingered arrangement of the word lines WL affords the further advantage of preventing any spurious switching due to possible capacitive couplings between adjacent word lines.

Figure 10:
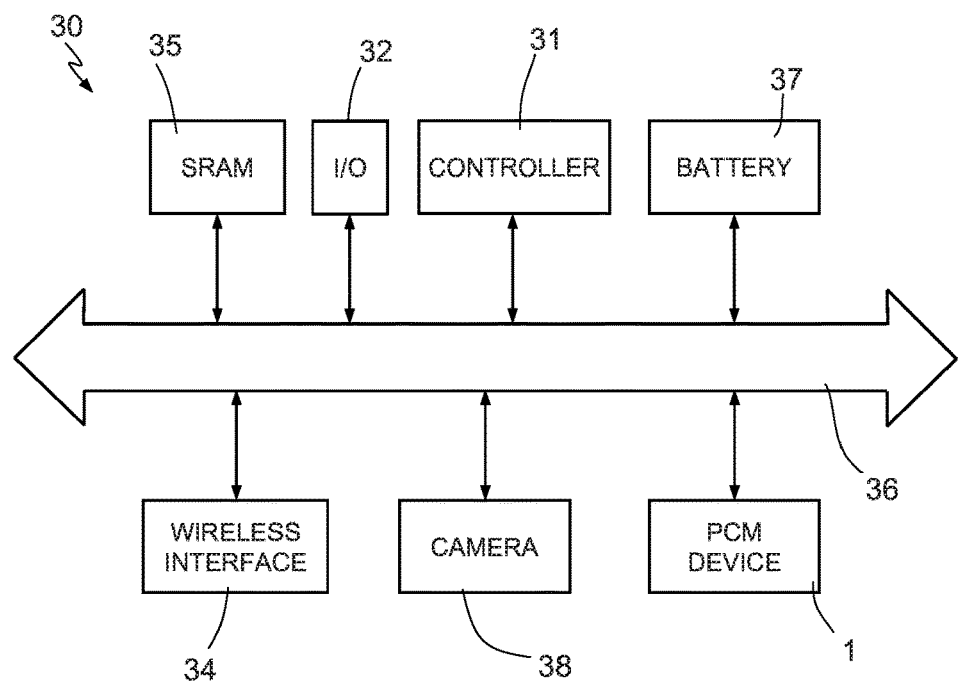
FIG. 10 is a simplified block diagram of an electronic system that incorporates the memory device, according to a further aspect of the present solution.

The aforesaid advantages thus render use of the memory device 1 particularly advantageous in an electronic system 30, as shown schematically in FIG. 10.

The electronic system 30 may be used in electronic devices, such as a PDA (Personal Digital Assistant), a portable or fixed computer, possibly with wireless data-transfer capacity, a mobile phone, a digital audio player; a photographic or video camera, or further portable devices that are able to process, store, transmit, and receive information.

In detail, the electronic system 30 comprises the memory device 1, provided with the array of memory cells of the phase-change type, described previously, and a controller 31 (for example, provided with a microprocessor, a DSP, or a microcontroller), both coupled to a bus 36 designed to carry signals (for example, for address selection) towards the memory device 1.

In addition, the electronic system 30 may optionally comprise, coupled to the bus 36, one or more of the following: an input/output device 32 (for example, provided with a keypad and a display), for input and display of data; a wireless interface 34, for example an antenna, for transmitting and receiving data through a radio-frequency wireless-communication network; a RAM 35; a battery 37, which may be used as electrical supply source in the electronic system 30; and a photographic and/or video camera 38.

According to a different embodiment, the controller 31 is coupled to the memory device 1 by a dedicated connection that is different from, and possibly additional to, the bus 36 (it being possible for the latter to be present or absent).

Finally, it is clear that modifications and variations may be made to the disclosure described and illustrated herein, without thereby departing from the scope of the present invention, as defined in the appended claims.

For instance, it is highlighted that, for row decoding, different and/or further row address-decoding signals could be used as compared to what has been illustrated. In addition, a different combination of the address-decoding signals could be used.

In particular, the number of row address-decoding signals and the number of tiles addressed by the same signals may vary with respect to what has been illustrated by way of example, according, for instance, to the parallelism used for the memory (programming and reading) operations.

Furthermore, the phase-change element of the memory cells could be replaced by a generic element with variable resistance, provided via any technology (not necessarily, phase-change technology).

What is claimed is:

1. A non-volatile memory device comprising:
   a memory array comprising a plurality of tiles, each tile of the plurality of tiles having word lines, bit lines, and memory cells coupled to the word lines and the bit lines; and
   a row decoder comprising:
      a plurality of main row decoding units, each main row decoding unit of the plurality of main row decoding units coupled to a respective group of tiles of the plurality of tiles; and
      a plurality of local row decoding units, each local row decoding unit of the plurality of local row decoding units coupled to a respective tile of the respective group of tiles and configured to carry out local selection and biasing of corresponding word lines based on decoded address signals and bias signals received from a respective main row decoding unit, wherein each local row decoding unit comprises a plurality of logic-combination modules, each logic-combination module of the plurality of logic-combination modules coupled to a respective set of word lines of the respective tile, and wherein each logic-combination module comprises, for each word line of the respective set of word lines:
         a pull-down stage coupled to a respective word line and controlled by respective decoded address signals for selecting the respective word line to bring the respective word line to a reference voltage for a specific combination of the respective decoded address signals; and
         a pull-up stage coupled to the respective word line and controlled to bring the respective word line to a tile-supply voltage, wherein the pull-up stage is dynamically biased by the respective main row decoding unit in a strong-biasing condition towards the tile-supply voltage, in a non-selected state of the respective word line, or in a weak-biasing condition towards the tile-supply voltage in a selected state of the respective word line.

2. The non-volatile memory device of claim 1, wherein the pull-up stage comprises a respective pull-up PMOS transistor coupled between the respective word line and a supply node configured to receive the tile-supply voltage, the respective pull-up PMOS transistor being configured to be controlled in an ON state by a respective biasing control signal from the respective main row decoding unit.

3. The non-volatile memory device of claim 1, wherein the pull-up stage comprises a respective pull-up PMOS transistor coupled between the respective word line and a supply node configured to receive the tile-supply voltage, the respective pull-up PMOS transistor having a control terminal configured to receive from the respective main row decoding unit a respective biasing control signal, wherein the respective biasing control signal comprises a first voltage value configured to bias the respective pull-up stage in the strong-biasing condition or a second voltage value higher than the first voltage value and configured to bias the respective pull-up stage in the weak-biasing condition.

4. The non-volatile memory device of claim 3, wherein pull-up PMOS transistors of pull-up stages of a same logic-combination module are configured to receive in respective control terminals a same biasing control signal.

5. The non-volatile memory device of claim 3, wherein each main row decoding unit comprises a plurality of pull-up decoding modules, each pull-up decoding module of the plurality of pull-up decoding modules configured to generate the respective biasing control signal for respective logic-combination modules, wherein each pull-up decoding module is configured to generate the respective biasing control signal having the first voltage value or the second voltage value as a function of a value of one or more of the respective decoded address signals.

6. The non-volatile memory device of claim 1, wherein a set of tile-selection modules is associated to each main row decoding unit, wherein each tile-selection module of the set of tile-selection modules is associated with the respective tile of the respective group of tiles, and wherein each tile-selection module is configured to individually select the respective tile for a memory operation as a function of a tile-selection signal.

7. The non-volatile memory device of claim 6, wherein each tile-selection module comprises a controlled switch element configured to:
   couple the respective tile to a supply voltage of the non-volatile memory device to generate the tile-supply voltage; and
   decouple the respective tile from the supply voltage to insulate the respective tile.

8. The non-volatile memory device of claim 1, wherein each local row decoding unit is formed by a first local-decoding element and a second local-decoding element, the first local-decoding element and the second local-decoding element arranged on opposite sides of the respective tile in a direction of the word lines, each of the first and second local-decoding elements being coupled to a respective set of word lines arranged in a comb-fingered configuration.

9. The non-volatile memory device of claim 1, wherein the pull-down stage implements a NAND logic combination of respective decoded address signals for selection of the respective word line.

10. The non-volatile memory device of claim 9, wherein the pull-down stage comprises:
   a first pull-down MOS transistor having a control terminal configured to receive a first decoded address signal of the respective decoded address signals;

a second pull-down MOS transistor having a control terminal configured to receive a second decoded address signal of the respective decoded address signals; and a third pull-down MOS transistor having a control terminal configured to receive a third decoded address signal of the respective decoded address signals, wherein the first, second, and third pull-down MOS transistors are connected in series between a first internal node, and a reference terminal, the first internal node coupled to the respective word line.

11. The non-volatile memory device of claim 1, wherein the decoded address signals and the biasing signals are routed from each main row decoding unit to associated local row decoding units coupled to respective tiles of the respective group of tiles by signal lines, wherein the signal lines extend horizontally from each main row decoding unit, in a direction parallel to the word lines, through the respective group of tiles, in an area distinct from an area occupied by the memory cells of the respective tiles, and wherein, at each tile, the signal lines extend vertically, in a direction parallel to the bit lines, so as to reach local-decoding elements of respective local row decoding unit, the respective local row decoding units arranged on opposite sides of the same tile.

12. The non-volatile memory device of claim 1, wherein each main row decoding unit is configured to supply the same decoded address signals and biasing signals to the local row decoding units associated to all tiles of the respective group of tiles.

13. The non-volatile memory device of claim 1, wherein the non-volatile memory device is a phase-change-memory (PCM) device.

14. A non-volatile memory device of the phase-change-memory (PCM) type, the device comprising:
 a memory array comprising a plurality of tiles, each tile of the plurality of tiles having word lines, bit lines, and PCM memory cells coupled to the word lines and the bit lines; and
 a row decoder comprising:
  a plurality of main row decoding units, each main row decoding unit of the plurality of main row decoding units coupled to a respective group of tiles of the plurality of tiles; and
  a plurality of local row decoding units, each local row decoding unit of the plurality of local row decoding units coupled to a respective tile of the respective group of tiles and configured to carry out local selection and biasing of corresponding word lines based on decoded address signals and bias signals received from a respective main row decoding unit, wherein each local row decoding unit comprises a plurality of logic-combination modules, each logic-combination module of the plurality of logic-combination modules coupled to a respective set of word lines of the respective tile, and wherein each logic-combination module comprises, for each word line of the respective set of word lines:
   a pull-down stage coupled to a respective word line and controlled by respective decoded address signals for selecting the respective word line to bring the respective word line to a reference voltage for a specific combination of the respective decoded address signals; and
   a pull-up stage coupled to the respective word line and configured to bring the respective word line to a tile-supply voltage, wherein the pull-up stage is dynamically biased by the respective main row decoding unit in a strong-biasing condition towards the tile-supply voltage, in a non-selected state of the respective word line, or in a weak-biasing condition towards the tile-supply voltage in a selected state of the respective word line, wherein the decoded address signals and the biasing signals are routed from the main row decoding unit to associated local row decoding units coupled to the respective tiles of the respective group of tiles by signal lines, wherein the signal lines extend horizontally from the main row decoding unit, in a direction parallel to the word lines, through the respective group of tiles, in an area distinct from an area occupied by the PCM memory cells of the respective tiles, and wherein, at each tile, the signal lines extend vertically, in a direction parallel to the bit lines, so as to reach local-decoding elements of respective local row decoding unit, the respective local row decoding units arranged on opposite sides of the same tile.

15. The device of claim 14, wherein the pull-up stage comprises a respective pull-up PMOS transistor coupled between the respective word line and a supply node configured to receive the tile-supply voltage, the respective pull-up PMOS transistor having a control terminal configured to receive from the respective main row decoding unit a respective biasing control signal, wherein the respective biasing control signal comprises a first voltage value configured to bias the respective pull-up stage in the strong-biasing condition or a second voltage value higher than the first voltage value and configured to bias the respective pull-up stage in the weak-biasing condition.

16. The device of claim 14, wherein a set of tile-selection modules is associated to each main row decoding unit, wherein each tile-selection module of the set of tile-selection modules is associated with the respective tile of the respective group of tiles, wherein each tile-selection module is configured to individually select the respective tile for a memory operation as a function of a tile-selection signal, wherein each tile-selection module comprises a controlled switch element configured to:
 couple the respective tile to a supply voltage of the non-volatile memory device to generate the tile-supply voltage; and
 decouple the respective tile from the supply voltage to insulate the respective tile.

17. The device of claim 14, wherein the respective word line is coupled to a base of a bipolar junction transistor (BJT), the BJT having an emitter coupled to a respective PCM memory cell of the PCM memory cells.

18. A row decoding method for a non-volatile memory device having a memory array that comprises a plurality of tiles, each tile having word lines and bit lines coupled to memory cells, the method comprising:
 receiving a decoded address signals from a main row decoding unit of the memory array, the main row decoding unit being associated with a group of tiles of the plurality of tiles;
 selecting a local word line of a tile of the group of tiles based on the decoded address signals;
 when the local word line is selected, pulling down the selected local word line to a reference voltage using a respective pull-down stage while simultaneously weakly pulling up the selected local word line to a tile-supply voltage using a respective pull-up stage; and when the local word line is unselected, strongly pulling up the local word line towards the tile-supply voltage using the respective pull-up stage.

19. The method of claim 18, wherein the respective pull-up stage comprises a respective pull-up PMOS transistor coupled between the local word line and a tile-supply node set to the tile-supply voltage, wherein strongly pulling up the local word line comprises biasing the respective pull-up PMOS transistor with a first voltage value, and wherein weakly pulling up the local word line comprises biasing the respective pull-up PMOS transistor with a second voltage value higher than the first voltage value.

20. The method of claim 18, further comprising individually selecting each tile of the group of tiles for a memory operation as a function of a tile-selection signal.

21. The method of claim 20, wherein individually selecting each tile comprises:
controlling a respective switch element to connect the selected tile to a supply voltage node set at a third voltage value; and
controlling respective switch elements to disconnected unselected tiles from the supply voltage node.

* * * * *